(12) United States Patent
Tsukamoto

(10) Patent No.: US 11,139,310 B2
(45) Date of Patent: Oct. 5, 2021

(54) SEMICONDUCTOR MEMORY DEVICE, ELECTRONIC APPARATUS, AND METHOD OF READING DATA

(71) Applicant: SONY SEMICONDUCTOR SOLUTIONS CORPORATION, Kanagawa (JP)

(72) Inventor: Masanori Tsukamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/767,643

(22) PCT Filed: Oct. 10, 2018

(86) PCT No.: PCT/JP2018/037648
§ 371 (c)(1),
(2) Date: May 28, 2020

(87) PCT Pub. No.: WO2019/111525
PCT Pub. Date: Jun. 13, 2019

(65) Prior Publication Data
US 2020/0373313 A1    Nov. 26, 2020

(30) Foreign Application Priority Data

Dec. 4, 2017    (JP) ............................. JP2017-232947

(51) Int. Cl.
*G11C 11/22* (2006.01)
*H01L 27/11507* (2017.01)
*H01L 49/02* (2006.01)

(52) U.S. Cl.
CPC ...... *H01L 27/11507* (2013.01); *G11C 11/221* (2013.01); *G11C 11/2273* (2013.01); *H01L 28/60* (2013.01)

(58) Field of Classification Search
CPC . H01L 27/11507; H01L 28/60; G11C 11/221; G11C 11/2273
(Continued)

(56) References Cited

U.S. PATENT DOCUMENTS

| 5,121,353 A | 6/1992 | Natori |
| 6,370,056 B1 * | 4/2002 | Chen ....................... G11C 11/22 365/145 |

(Continued)

FOREIGN PATENT DOCUMENTS

| JP | H03-040298 | 2/1991 |
| JP | H11-177038 | 7/1999 |

(Continued)

OTHER PUBLICATIONS

International Search Report and Written Opinion prepared by the Japanese Patent Office dated Nov. 29, 2018, for International Application No. PCT/JP2018/037648.

*Primary Examiner* — Viet Q Nguyen
(74) *Attorney, Agent, or Firm* — Sheridan Ross P.C.

(57) ABSTRACT

To provide a semiconductor memory device that avoids a voltage drop caused by an oxide film formed on a surface of a semiconductor substrate, and appropriately operates even in a case where a memory cell array is formed. A semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, and a plate line electrically coupled to the gate electrode of the first transistor and to the one of the capacitor electrodes.

18 Claims, 11 Drawing Sheets

(58) Field of Classification Search
USPC .......................................................... 365/145
See application file for complete search history.

(56) References Cited

U.S. PATENT DOCUMENTS

| | | | | |
|---|---|---|---|---|
| 6,580,633 | B2* | 6/2003 | Inoue | G11C 11/22 257/E21.663 |
| 6,623,989 | B2* | 9/2003 | Kang | C07D 233/08 257/E21.663 |
| 6,809,949 | B2* | 10/2004 | Ho | G11C 11/22 365/145 |
| 8,901,704 | B2* | 12/2014 | Kang | G06K 19/073 257/532 |
| 2002/0006052 | A1* | 1/2002 | Kato | G11C 11/22 365/145 |
| 2011/0170329 | A1* | 7/2011 | Kang | H01L 27/1159 365/145 |
| 2012/0134196 | A1* | 5/2012 | Evans, Jr. | G11C 27/005 365/145 |
| 2014/0165412 | A1* | 6/2014 | Morita | A01G 3/062 30/277.4 |
| 2014/0254276 | A1 | 9/2014 | Tokuhira et al. | |
| 2016/0111138 | A1* | 4/2016 | Izumi | G11C 11/221 365/65 |
| 2020/0357453 | A1* | 11/2020 | Slesazeck | G11C 11/5657 |

FOREIGN PATENT DOCUMENTS

| | | |
|---|---|---|
| JP | 2001-203277 | 7/2001 |
| JP | 2007-042172 | 2/2007 |
| JP | 2014-503930 | 2/2014 |
| JP | 2014-175480 | 9/2014 |

* cited by examiner

[FIG. 1]
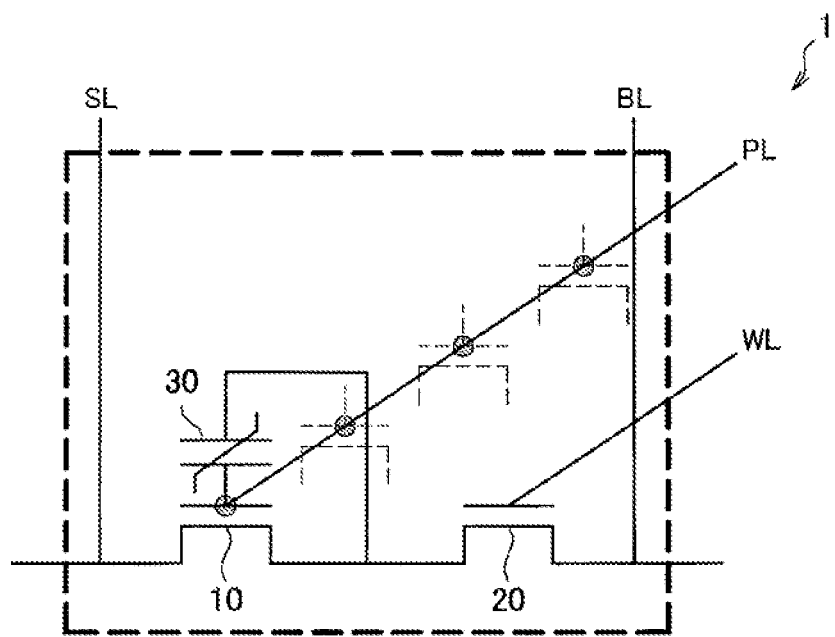

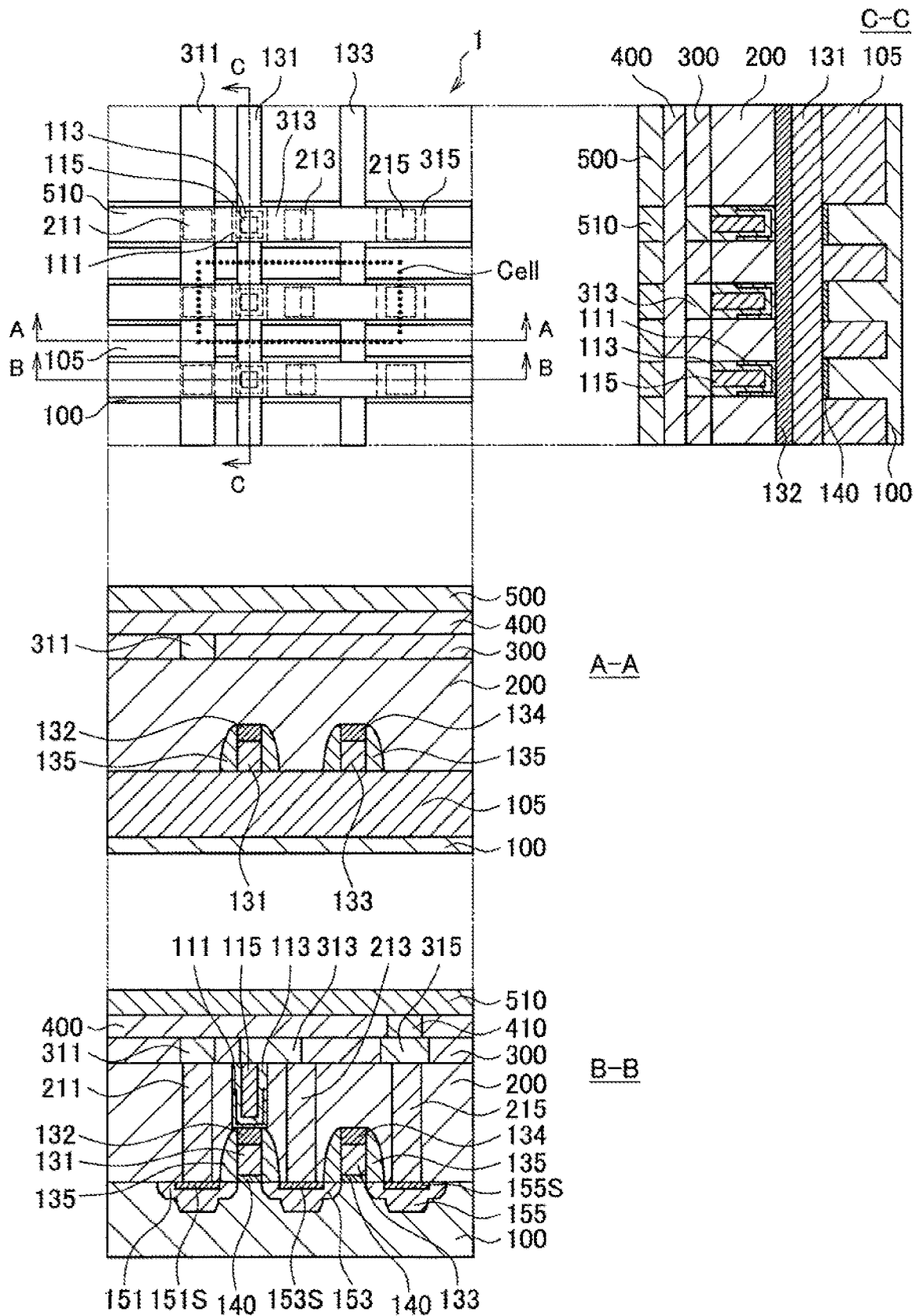
[ FIG. 2 ]

[FIG. 3]
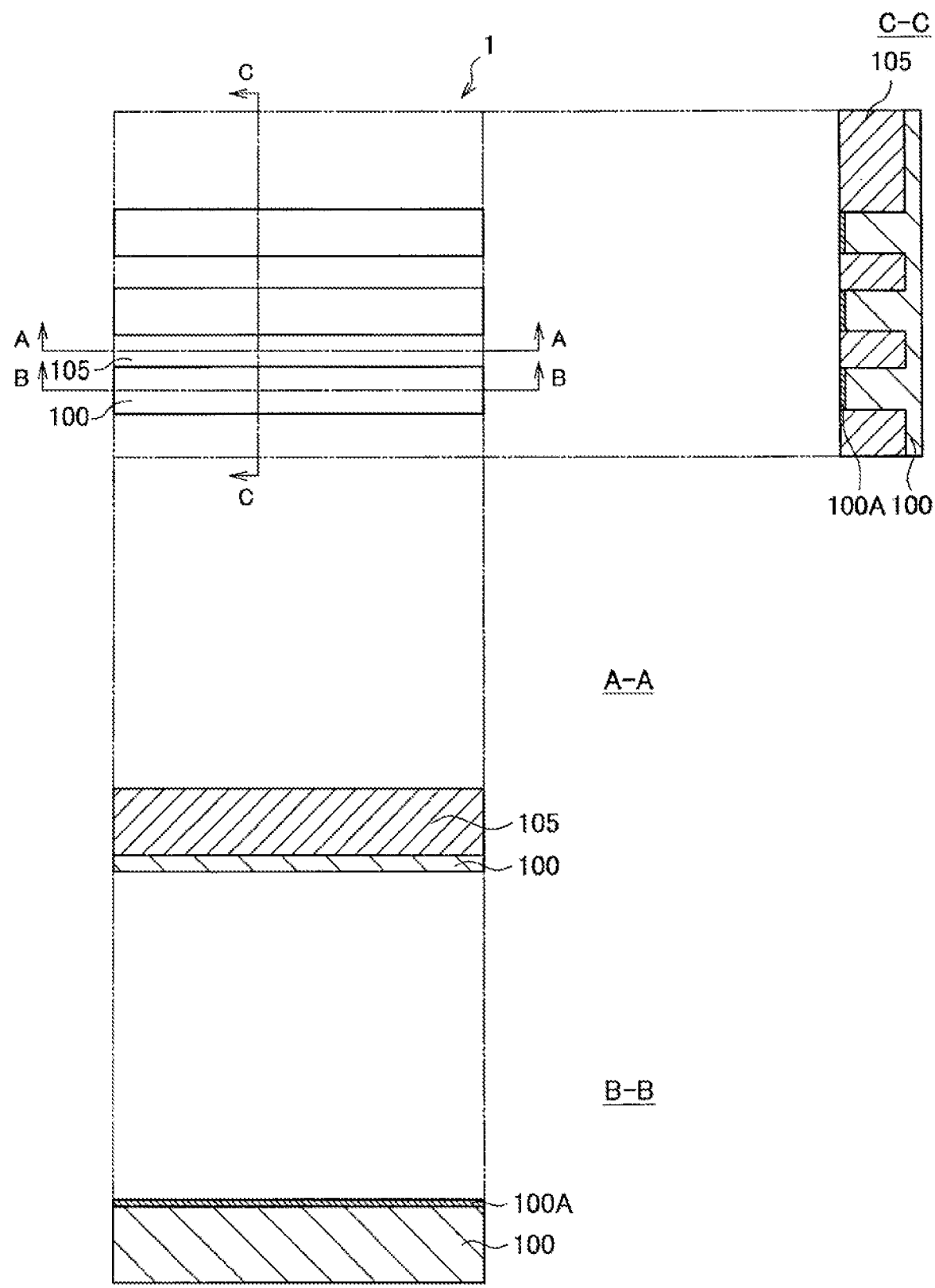

[ FIG. 4 ]
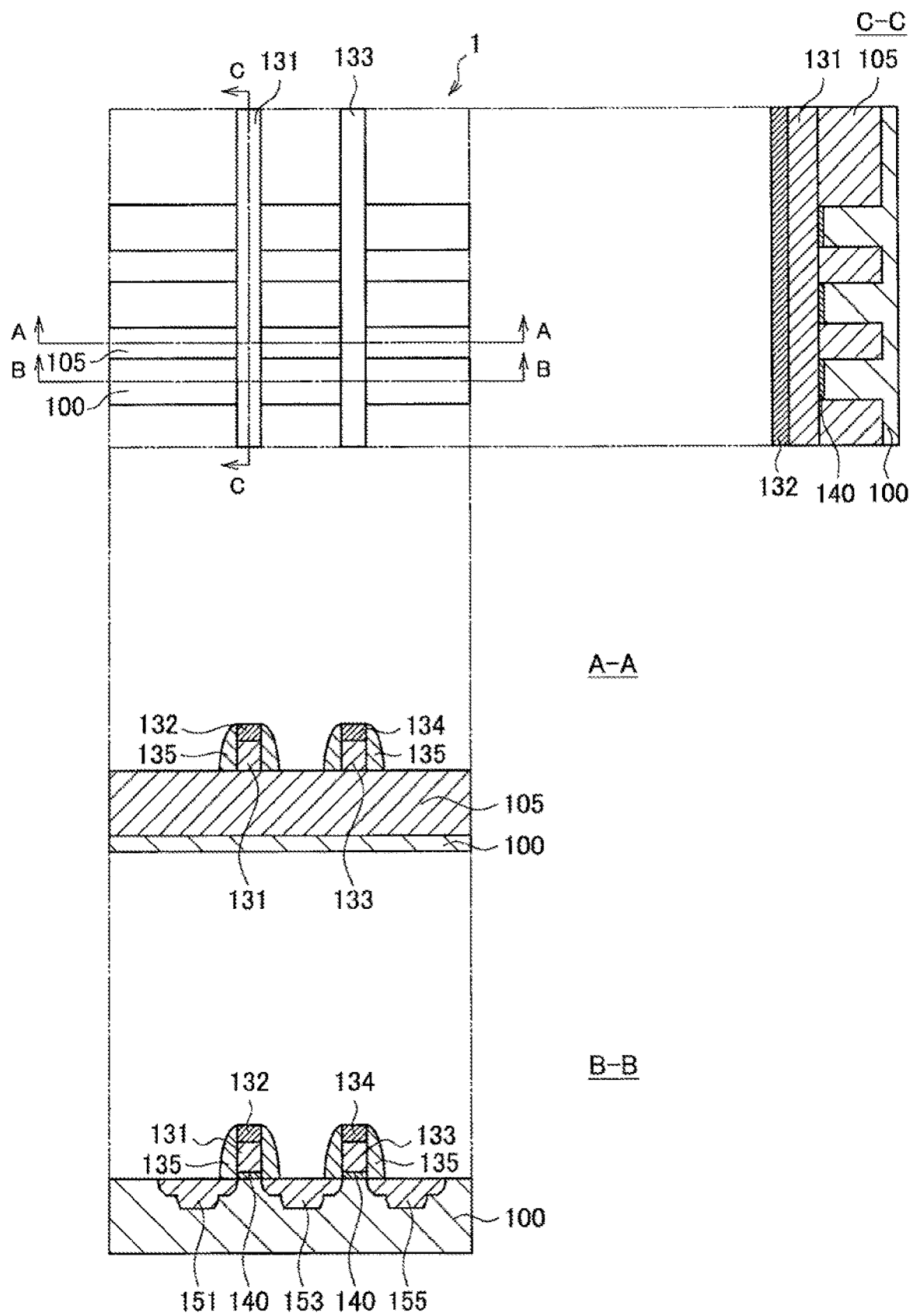

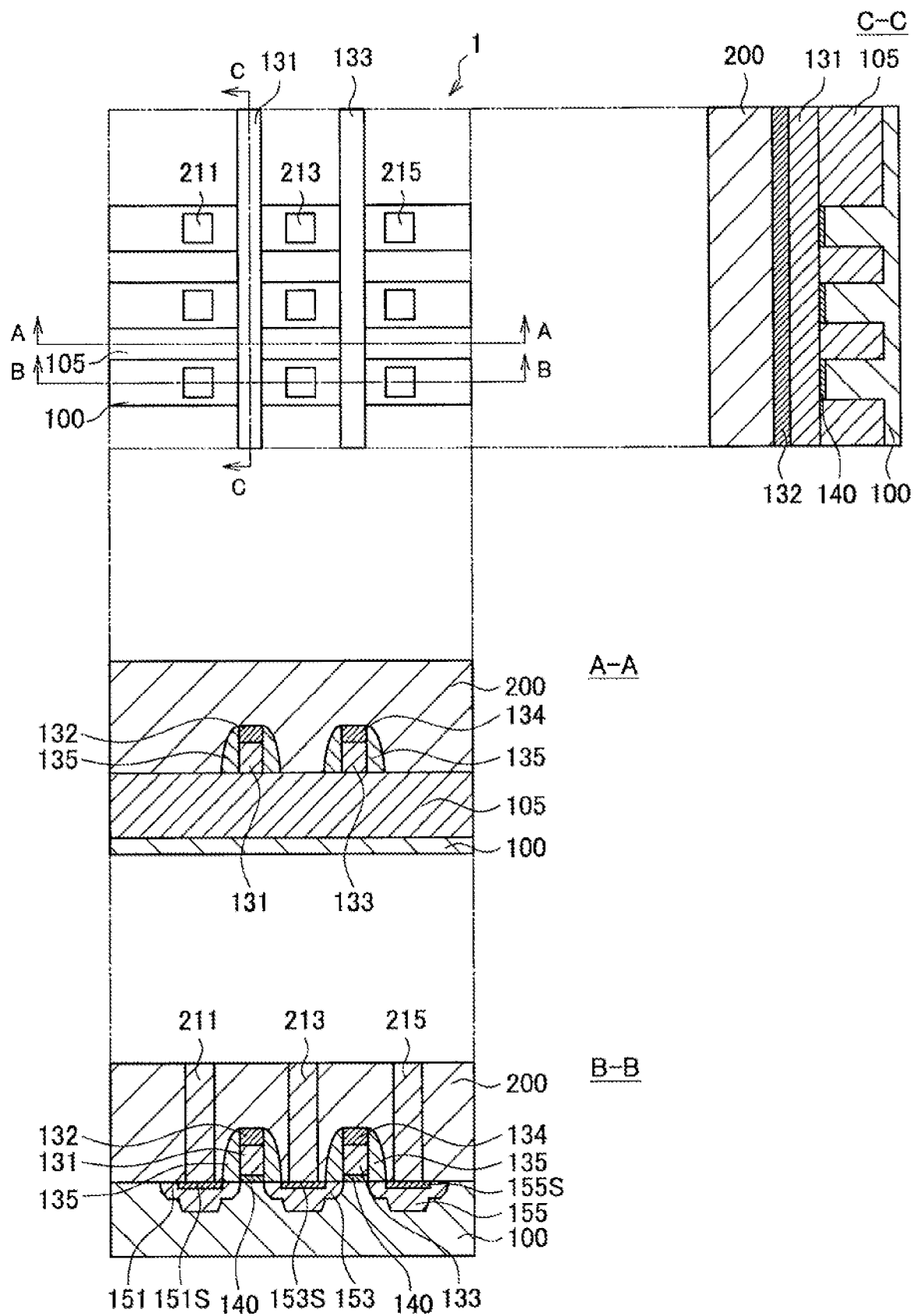
[ FIG. 5 ]

[ FIG. 6 ]
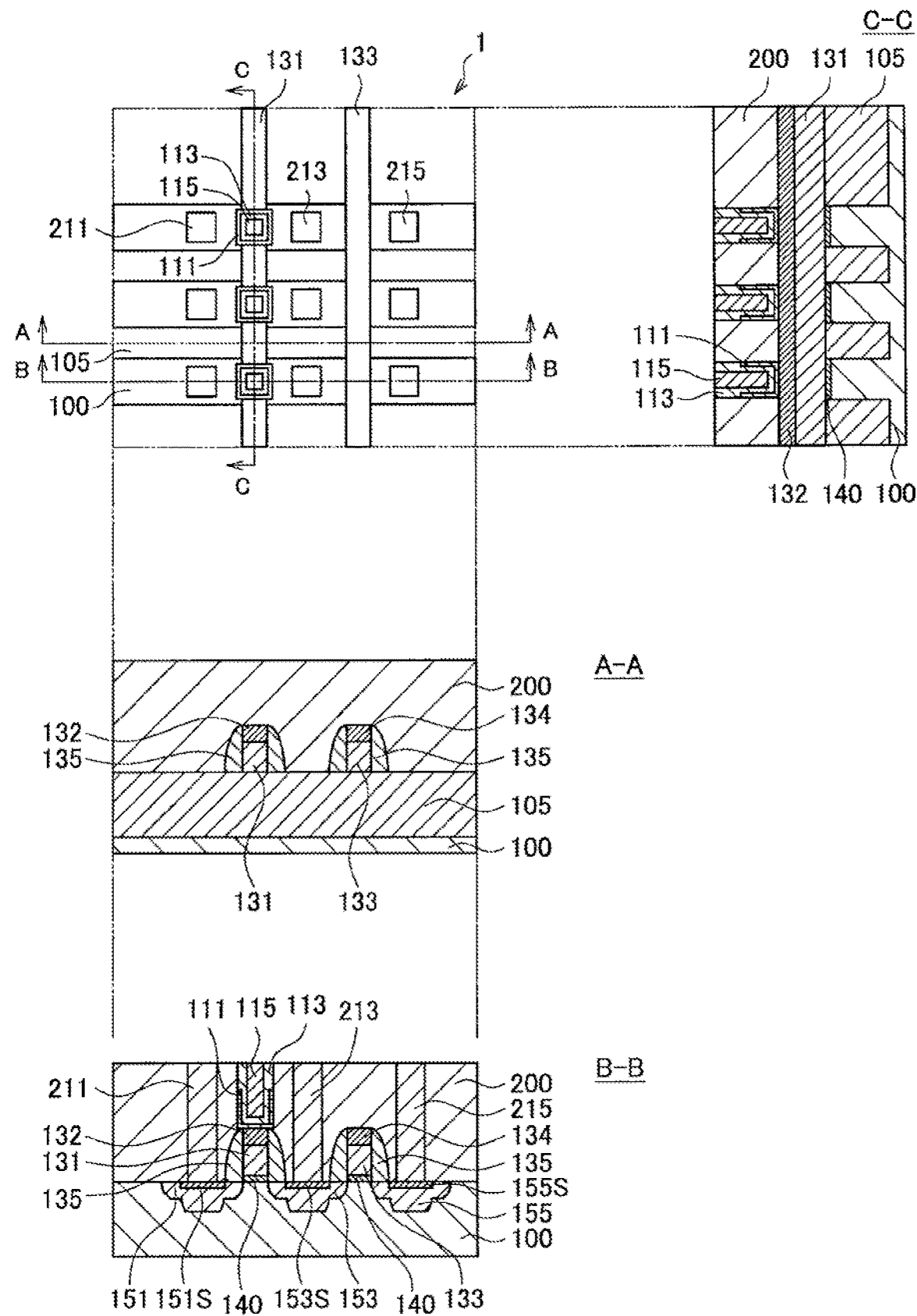

[ FIG. 7 ]
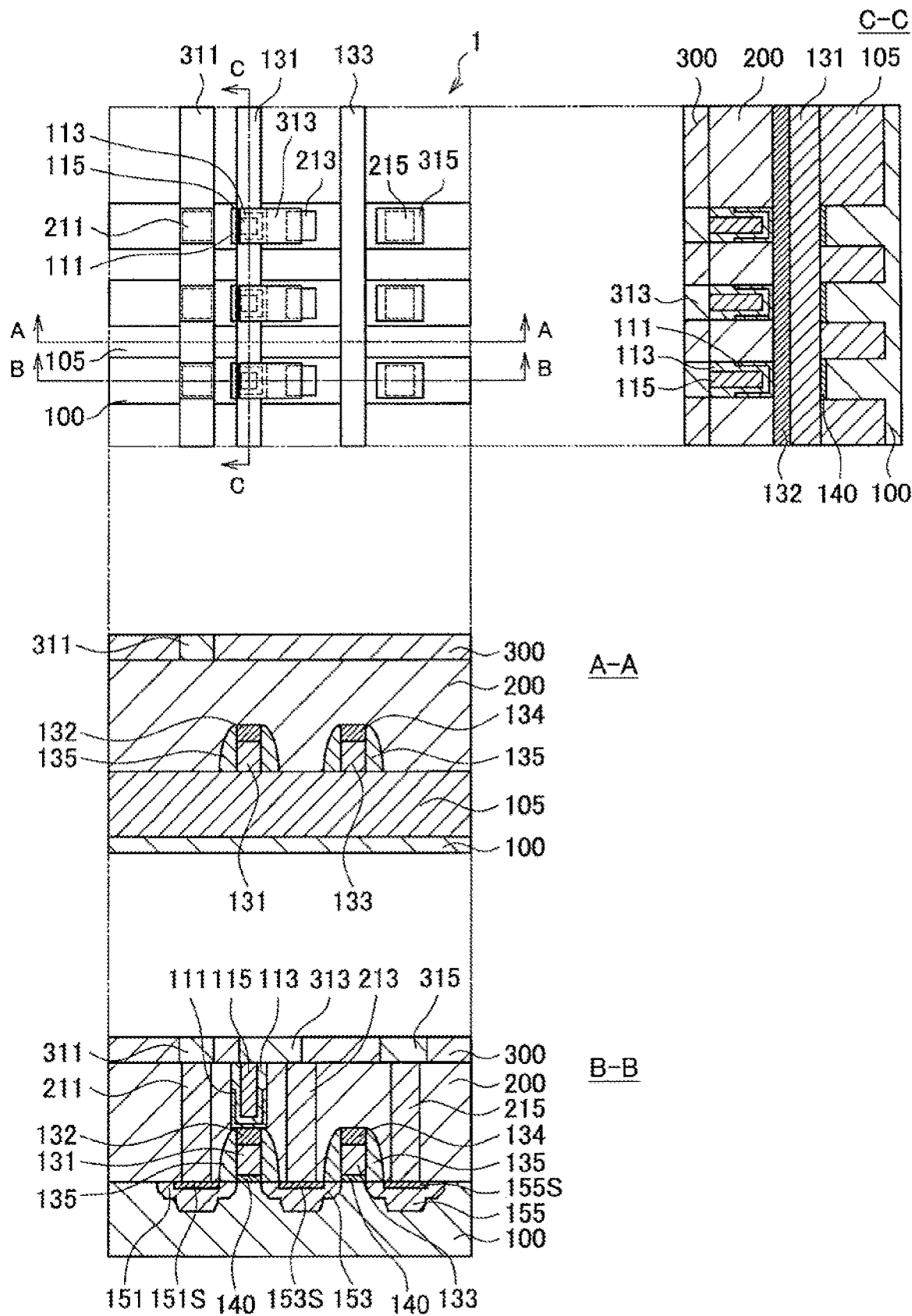

[FIG. 8]
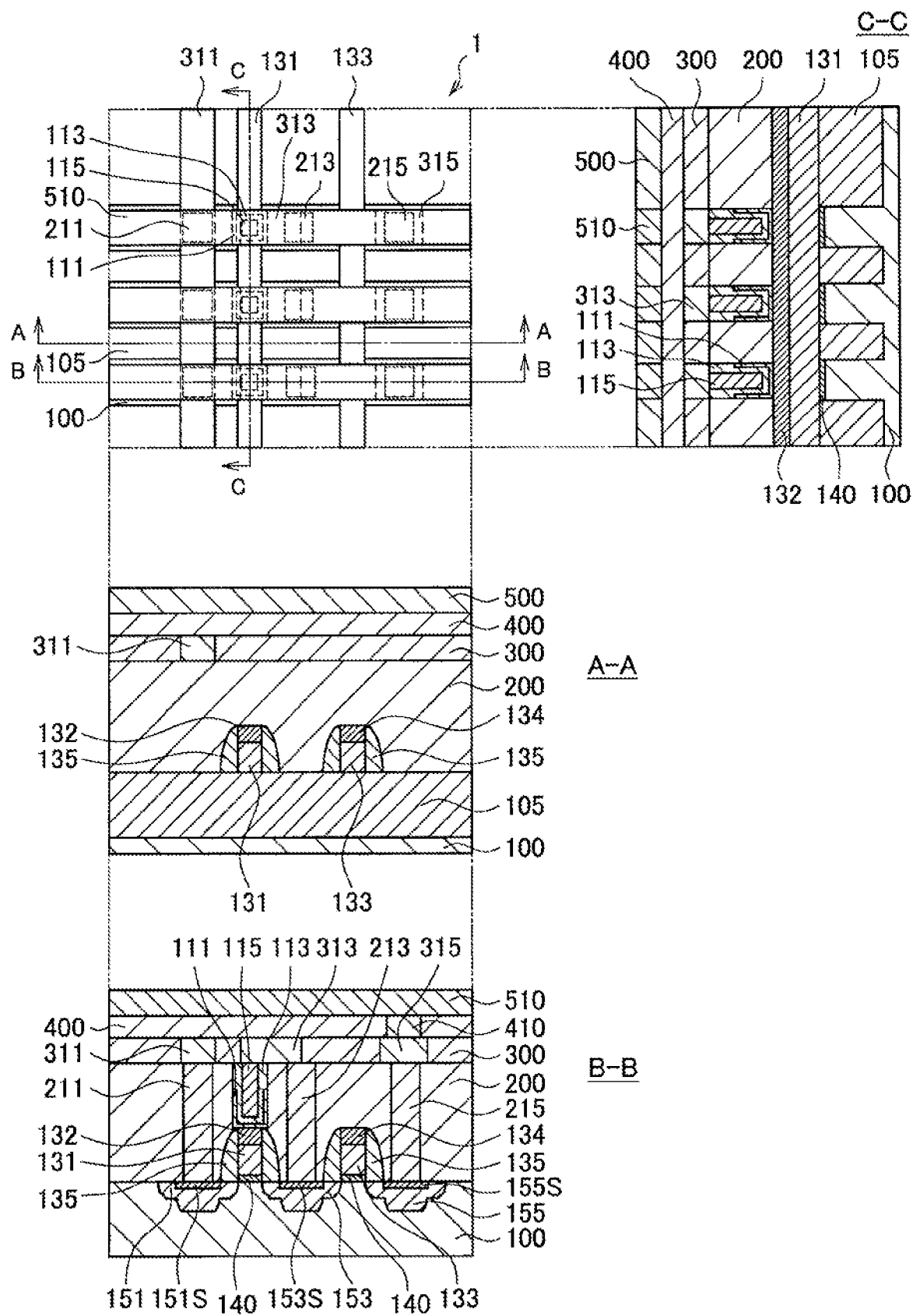

[ FIG. 9 ]
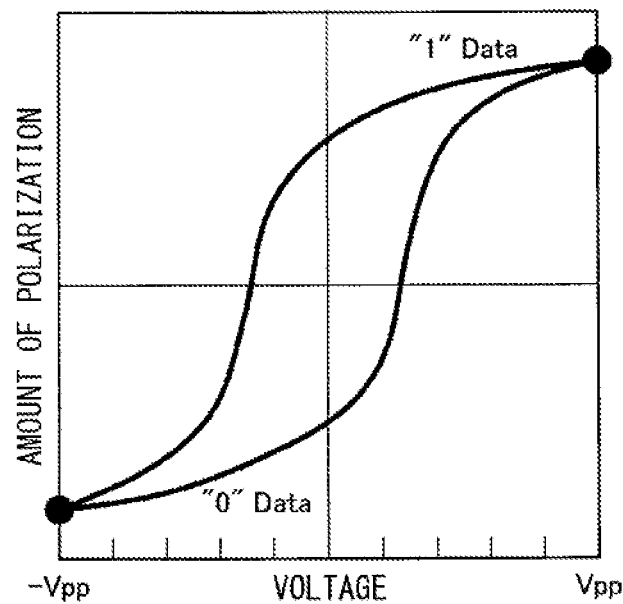
[ FIG. 10 ]
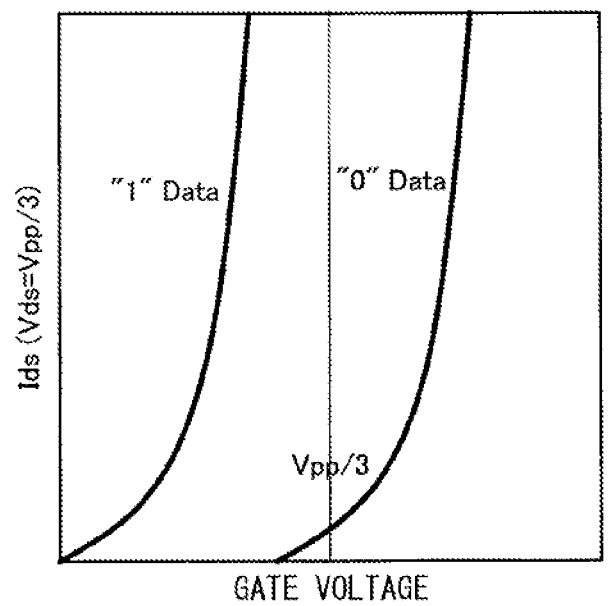

[ FIG. 11A ]
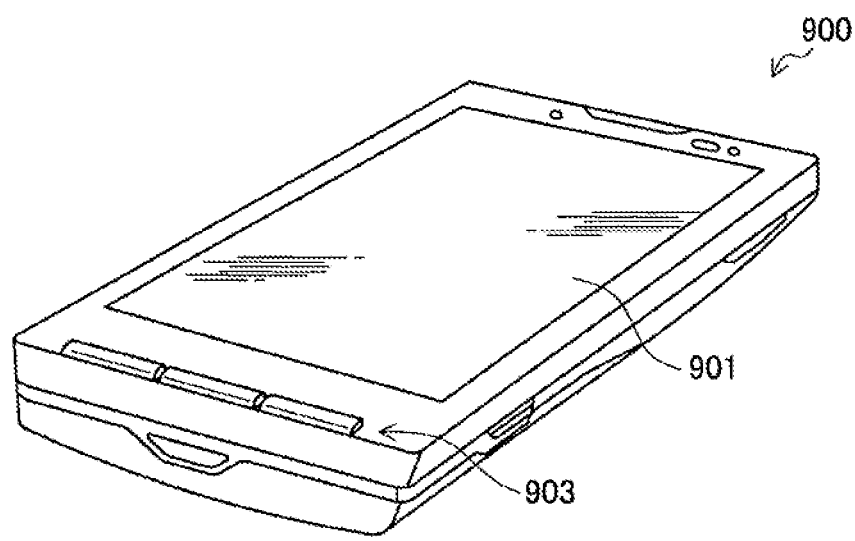
[ FIG. 11B ]
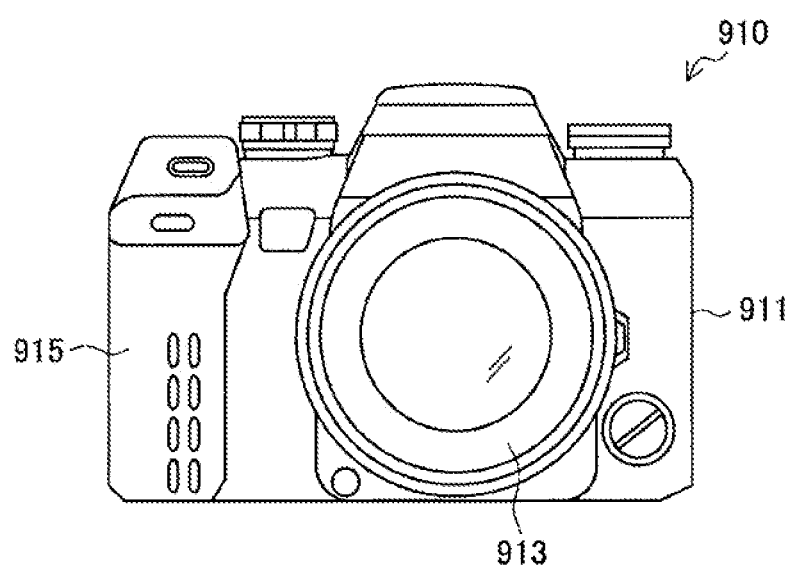

[ FIG. 11C ]
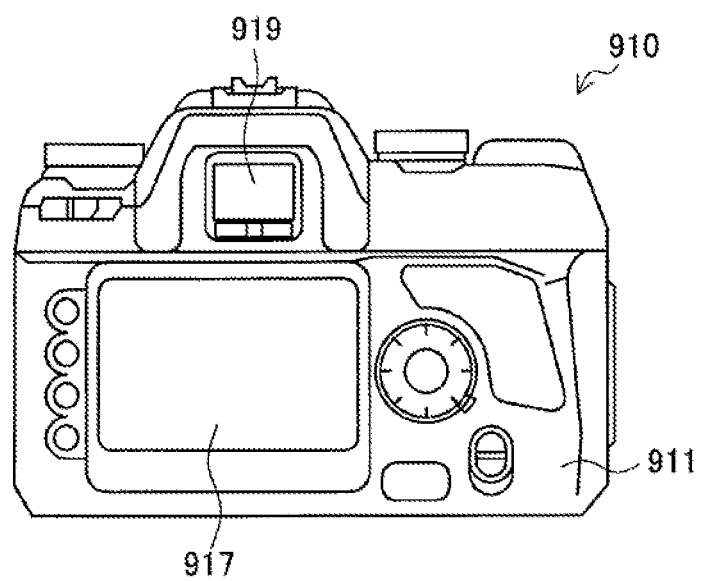

SEMICONDUCTOR MEMORY DEVICE, ELECTRONIC APPARATUS, AND METHOD OF READING DATA

CROSS REFERENCE TO RELATED APPLICATIONS

This application is a national stage application under 35 U.S.C. 371 and claims the benefit of PCT Application No. PCT/JP2018/037648 having an international filing date of 10 Oct. 2018, which designated the United States, which PCT application claimed the benefit of Japanese Patent Application No. 2017-232947 filed 4 Dec. 2017, the entire disclosures of each of which are incorporated herein by reference.

TECHNICAL FIELD

The present disclosure relates to a semiconductor memory device, an electronic apparatus, and a method of reading data.

BACKGROUND ART

A CMOS (Complementary MOS) circuit which includes an nMOSFET (n-type Metal-Oxide-Semiconductor Field-Effect Transistor) and a pMOSFET (p-type MOSFET) provided on a single substrate is known as a circuit whose power consumption is small, able to perform high-speed operation, and able to be miniaturized and highly integrated easily.

Therefore, CMOS circuits are used in many LSI (Large Scale Integration) devices. It is to be noted that such LSI devices have each recently been commercialized as an SoC (System on a Chip) which consolidates an analog circuit, a memory, and a logic circuit in one chip.

For a memory mounted on each of the LSI devices, a static RAM (Static Random Access Memory: SRAM) or the like is used, for example. In recent years, it has been considered to use a Dynamic RAM (DRAM), a Magnetic RAM (MRAM), or a Ferroelectric RAM (FeRAM), instead of the SRAM, to cause the cost and the power consumption of the LSI device to be further reduced.

Here, the FeRAM is a semiconductor memory device that stores data using an orientation of remanent polarization of a ferroelectric. As a structure of a FeRAM, for example, a 1T (1 Transistor)-type structure using a field-effect transistor using a ferroelectric material as a gate insulating film as a memory cell has been proposed.

Such a FeRAM having the 1T-type structure has a ferroelectric film and a gate electrode stacked on a semiconductor substrate, and controls the remanent polarization of the ferroelectric film by an electric field between the gate electrode and the semiconductor substrate (or a well) or between the gate electrode and a source/drain. However, in the FeRAM having the 1T type structure, an oxide film is formed on a surface of the semiconductor substrate, thus, voltage effectively applied to the ferroelectric film is lowered due to a voltage drop caused by the oxide film.

Therefore, a technique disclosed in Patent Literature 1 below has been proposed, for example, to allow the voltage drop caused by the oxide film formed on the surface of the semiconductor substrate to be avoided.

Specifically, Patent Literature 1 discloses a ferroelectric memory element using a metal-ferroelectric-metal-insulator-semiconductor (MFMIS)-type field effect transistor. The ferroelectric memory element disclosed in Patent Literature 1 applies a voltage to a metal-ferroelectric-metal stacked structure, thus makes it possible to avoid a voltage drop caused by the oxide film (insulator).

CITATION LIST

Patent Literature

PTL 1: Japanese Unexamined Patent Application Publication No. H11-177038

SUMMARY OF THE INVENTION

Problems to be Solved by the Invention

However, in the ferroelectric memory element disclosed in Patent Literature 1, only a structure of one memory cell has been examined. Therefore, in a case where the ferroelectric memory elements disclosed in Patent Literature 1 are disposed in an array to form a memory cell array, data stored in a memory cell may be affected by writing or reading of data to or from another memory cell. Specifically, in a case where data is written by applying a voltage to the ferroelectric memory element, a voltage is also applied to another ferroelectric memory element, and data stored in the other ferroelectric memory element is rewritten (also referred to as a Write Disturb).

Therefore, there has been a demand for a semiconductor memory device that is able to avoid, at a time of writing, a voltage drop caused by an oxide film formed on a surface of a semiconductor substrate, and to appropriately operate even in a case where a memory cell array is formed.

Means for Solving the Problems

According to the present disclosure, there is provided a semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, and a plate line electrically coupled to the gate electrode of the first transistor and to the one of the capacitor electrodes.

Further, according to the present disclosure, there is provided an electronic apparatus including a semiconductor memory device, the semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, and a plate line electrically coupled to the gate electrode of the first transistor and to the one of the capacitor electrodes.

Further, according to the present disclosure, there is provided a method of reading data that is performed on a semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, a plate line electrically coupled to the gate electrode of the first transistor and to the one of the capacitor electrodes, a word line electrically coupled to a gate electrode of the second transistor, a source line electrically coupled to another of the source or the drain of the first transistor, and a bit line electrically coupled to another of the source or the drain of the second transistor, the method including reading data stored in the capacitor by causing the plate line to be in a floating state, applying a voltage larger than or equal to a threshold voltage of the second transistor to the word line, and applying a predetermined voltage between the bit line and the source line.

According to the present disclosure, the gate electrode of the first transistor, which is a reading transistor, is electrically coupled to the electrode of the capacitor that stores data; thus, it is possible to control accesses to the first transistor and the capacitor by the second transistor. In addition, the provision of the plate line that electrically couples the gate electrode of the first transistor to the electrode of the capacitor causes the voltage applied between the pair of electrodes of the capacitor to be independently controlled.

Effects of the Invention

As described above, according to the present disclosure, it is possible to provide the semiconductor memory device that is able to avoid, at the time of writing, the voltage drop caused by the oxide film formed on the surface of the semiconductor substrate, and to appropriately operate even in the case where the memory cell array is formed.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is a circuit diagram illustrating an analogous circuit of a semiconductor memory device according to an embodiment of the present disclosure.

FIG. 2 is a schematic view of a planar structure and a cross-sectional structure of the semiconductor memory device according to the embodiment.

FIG. 3 is a plan view and a cross-sectional view explaining a process of a method of manufacturing the semiconductor memory device according to the embodiment.

FIG. 4 is a plan view and a cross-sectional view explaining a process of the method of manufacturing the semiconductor memory device according to the embodiment.

FIG. 5 is a plan view and a cross-sectional view explaining a process of the method of manufacturing the semiconductor memory device according to the embodiment.

FIG. 6 is a plan view and a cross-sectional view explaining a process of the method of manufacturing the semiconductor memory device according to the embodiment.

FIG. 7 is a plan view and a cross-sectional view explaining a process of the method of manufacturing the semiconductor memory device according to the embodiment.

FIG. 8 is a plan view and a cross-sectional view explaining a process of the method of manufacturing the semiconductor memory device according to the embodiment.

FIG. 9 is a graph illustrating an example of a hysteresis curve between an amount of polarization of a ferroelectric film and an applied voltage.

FIG. 10 is a graph illustrating an example of a relationship between a voltage applied to a gate of a first transistor and an electric current that flows between a source and a drain.

FIG. 11A is an external view of an example of an electronic apparatus according to an embodiment of the present disclosure.

FIG. 11B is an external view of another example of an electronic apparatus according to an embodiment of the present disclosure.

FIG. 11C is an external view of another example of an electronic apparatus according to an embodiment of the present disclosure.

MODES FOR CARRYING OUT THE INVENTION

The following describes a preferred embodiment of the present disclosure in detail with reference to the accompanying drawings. It is to be noted that, in this description and the accompanying drawings, components that have substantially the same functional configuration are indicated by the same reference signs, and thus redundant description thereof is omitted.

In the drawings referred to in the following description, for convenience of description, sizes of some of the constituent members may be exaggerated. Accordingly, the relative sizes of the constituent members illustrated in the drawings may not necessarily accurately express the magnitude relationship between the actual constituent members. Moreover, in the following description, a direction in which a substrate or a layer is stacked may be referred to as an above direction.

Further, is to be noted that description is given in the following order.

1. Outline
2. Configuration Example
3. Manufacturing Method
4. Operation Example
5. Application Example 1. Outline First, referring to FIG. 1, an outline of a semiconductor memory device according to an embodiment of the present disclosure will be described. FIG. 1 is a circuit diagram illustrating an analogous circuit of the semiconductor memory device according to the present embodiment. It is to be noted that in FIG. 1, "gate" represents a gate electrode of a field effect transistor, "drain" represents a drain electrode or a drain region of the field effect transistor, and "source" represents a source electrode or a source region of the field effect transistor.

As illustrated in FIG. 1, the semiconductor memory device 1 includes a capacitor 30 that stores data, a first transistor 10 used when reading data stored in the capacitor 30, and a second transistor 20 that controls selection or non-selection of the capacitor 30. For example, in FIG. 1, a single memory cell that stores 1-bit data in 0 or 1 is configured by a configuration surrounded by a dashed line.

The capacitor 30 is a ferroelectric capacitor includes a pair of electrodes opposed to each other via a ferroelectric. The capacitor 30 may store data using an orientation of remanent polarization of a ferroelectric controlled by a direction of an electric field applied to the pair of electrodes. One of the pair of electrodes of the capacitor 30 is electrically coupled to a plate line PL and a gate of the first transistor 10. The other of the pair of electrodes of the capacitor 30 is electrically coupled to: one of a source or a drain of the first transistor 10; and one of a source or a drain of the second transistor 20.

Similarly, to the plate line PL, one of a pair of electrodes of a capacitor of another memory cell and the gate of the first transistor 10 are electrically coupled. Thus, the semiconductor memory device 1 includes a memory cell array in which a plurality of memory cells that stores 1-bit data is disposed.

The first transistor 10 is a field effect transistor used when reading data stored in the capacitor 30. One of the source or the drain of the first transistor 10 is electrically coupled to one of the source or the drain of the second transistor 20, and the other of the source and the drain of the first transistor 10 is electrically coupled to a source line. Further, the gate of the first transistor 10 is electrically coupled to one of the pair of electrodes of the capacitor 30.

In the first transistor 10, magnitude of a threshold voltage that controls a channel varies in accordance with an orientation of remanent polarization of a ferroelectric of the capacitor 30 electrically coupled to the gate. Thus, by detecting the magnitude of electric current flowing through the channel of the first transistor 10 when a voltage is applied to the gate of first transistor 10, it is possible to detect the orientation of the remanent polarization of the ferroelectric of the capacitor 30.

The second transistor 20 is a field effect transistor that controls selection and non-selection of the capacitor 30. One of the source or the drain of the second transistor 20 is electrically coupled to the other of the pair of electrodes of the capacitor 30, and the other of the source and the drain of the second transistor 20 is electrically coupled to a bit line BL. A gate of the second transistor 20 is electrically coupled to a word line WL, and a channel state of the second transistor 20 is controlled by a voltage applied from the word line WL.

In such a semiconductor memory device 1, in a case where data is to be written to the capacitor 30, the channel of the second transistor 20 is first changed to an on-state by applying a voltage to the word line WL. Thereafter, by applying a predetermined potential difference between the plate line PL and the bit line BL, an electric field is applied to the ferroelectric provided between the pair of electrodes of capacitor 30. As a result, the semiconductor memory device 1 is able to control the orientation of the remanent polarization of the ferroelectric of capacitor 30 by an external electric field, thus is able to write data in the capacitor 30.

In contrast, in a case where data is read from the capacitor 30 in the semiconductor memory device 1, the channel of the second transistor 20 is first changed to the on-state by applying a voltage to the word line WL. Thereafter, while causing the plate line PL to be in a floating state, a relatively low voltage is applied to the bit line BL and a voltage is applied to the gate of the first transistor 10. At this time, in the first transistor 10, since the threshold voltage at which the channel is changed to the on-state varies in accordance with the orientation of the remanent polarization of the ferroelectric of the capacitor 30, the magnitude (or the presence or absence) of the electric current flowing between the source and the drain varies. Accordingly, the semiconductor memory device 1 is able to read data stored in the capacitor 30 by measuring the electric current flowing between the source and the drain of the first transistor 10.

This allows the semiconductor memory device 1 to operate as a FeRAM (Ferroelectric Random Access Memory) that causes the capacitor 30 to store data.

Alternatively, a 1T1C (1 Transistor-1 Capacitor) structure and a 1T (1 Transistor) structure are proposed as a structure of the FeRAM that stores data in the remanent polarization of the ferroelectric.

The FeRAM of the 1T1C structure includes one field effect transistor and one ferroelectric capacitor, and stores data using the orientation of the remanent polarization in the ferroelectric capacitor in which the selection or non-selection is controlled by the field effect transistor.

However, in the FeRAM of the 1T1C structure, a large-capacity ferroelectric capacitor is demanded for obtaining a signal amount enough to be detected by a sense amplifier when the stored data is read. For this reason, a size of the ferroelectric capacitor in the FeRAM of the 1T1C structure increases, and an area occupied by the memory cell increases. Also, in the FeRAM of the 1T1C structure, predetermined data (either 0 or 1) is written to the ferroelectric capacitor, thereby reading (i.e., destructively reading) data from the ferroelectric capacitor; therefore, it is necessary to rewrite data to the ferroelectric capacitor after reading.

The FeRAM of the 1T structure includes a ferroelectric FET (field effect transistor) using a ferroelectric film as a gate insulating film, and data is stored using an orientation of remanent polarization of the gate insulating film.

However, in the FeRAM of the 1T type structure, since an oxide film is formed on a surface of a semiconductor substrate forming a ferroelectric FET, only some of the electric field applied between a gate and the semiconductor substrate (or a well) or between the gate and a source/a drain is applied to the gate insulating film. For this reason, in the FeRAM of the 1T type structure, a voltage applied to the gate of the ferroelectric FET when data is to be written to a memory cell is increased. Further, the FeRAM of the 1T type structure has a plurality of ferroelectric FETs disposed in an array. Therefore, to prevent data stored in the non-selected ferroelectric FET from being rewritten (Write Disturb), it has been necessary to take measures such as providing a field effect transistor that controls selection or non-selection of the ferroelectric FET.

In the semiconductor memory device 1 according to the present embodiment, data is stored in the capacitor 30 including a metal-ferroelectric-metal, and the selection of non-selection of the capacitor 30 is controlled by the second transistor 20. According to such a configuration, the semiconductor memory device 1 is able to directly apply an electric field to the ferroelectric owing to absence of an oxide film between a pair of electrodes of the capacitor 30; therefore, it is possible to avoid occurrence of a voltage drop caused by the oxide film and to suppress a rise of a write voltage.

In addition, the semiconductor memory device 1 is provided with the second transistor 20 that controls the selection and non-selection of the capacitor 30; therefore, it is possible to control the presence or absence of voltage application to the capacitor 30 by the second transistor 20. Thus, the semiconductor memory device 1 is able to prevent data stored in the unselected memory cell from being rewritten during the writing of data to the selected memory cell. In addition, the semiconductor memory device 1 is able to apply a voltage only to the capacitor 30 of the selected memory cell at the time of writing data: therefore, it is possible to suppress degradation of the ferroelectric of the capacitor 30.

Furthermore, the semiconductor memory device 1 is able to vary the threshold voltage of the first transistor 10 in accordance with the orientation of the remanent polarization of the ferroelectric of the capacitor 30. According to this, when reading data, the semiconductor memory device 1 is able to amplify and detect the remanent polarization of the ferroelectric of the capacitor 30 as an electric current amount flowing between the source and the dram of the first transistor 10. That is, the semiconductor memory device 1 may operate as again cell. According to such a configuration, the semiconductor memory device 1 is able to operate more stably because it is possible to increase a margin of detecting signals even in a case where the amount of polarization of the capacitor 30 is small.

2. Configuration Example

Next, referring to FIG. 2, a specific configuration of the semiconductor memory device 1 according to the present embodiment will be described. FIG. 2 is a schematic view of a planar structure and a cross-sectional structure of the semiconductor memory device 1 according to the present embodiment.

In the plan view of FIG. 2, layers formed over an entire surface of the semiconductor substrate 100 are omitted and are illustrated as a plan transmissive view, to clarify placement of components. Cross-sectional views of FIG. 2 respectively illustrate cross-sections of the plan view each taken along corresponding one of a line A-A, a line B-B, and a line C-C.

In the following description, a "first conductivity type" represents one of a "p-type" or an "n-type" and a "second conductivity type" represents the other of the "p-type" and the "n-type" which is different from "first conductivity type".

As illustrated in FIG. 2, the semiconductor memory device is provided on the semiconductor substrate 100. The semiconductor memory device 1 configures a memory device that is able to store a large amount of data by placing, on the semiconductor substrate 100, a large number of memory cells each storing 1-bit data in a matrix. In FIG. 2, a region Cell surrounded by a dashed line corresponds to one memory cell.

A first transistor 10 includes a gate insulating film 140 provided on the semiconductor substrate 100, a gate electrode 131 provided on the gate insulating film 140, and source or drain regions 151 and 153 provided on the semiconductor substrate 100. The gate electrode 131 functions as the plate line PL by being provided across memory cells, and is electrically coupled to a first capacitor electrode 111 provided on the gate electrode 131. The source or drain region 151 is electrically coupled to a first wiring layer 311 (source line SL) via a contact 211. The source or drain region 153 also functions as a source or drain region of the second transistor 20 and is electrically coupled to a second capacitor electrode 115 via a contact 213 and a first wiring layer 313.

The second transistor 20 includes the gate insulating film 140 provided on the semiconductor substrate 100, a gate electrode 133 provided on the gate insulating film 140, and source or drain regions 153 and 155 provided on the semiconductor substrate 100. The gate electrode 133 functions as the word line WL by being provided across memory cells. The source or drain region 153 also functions as a source or drain region of the first transistor 10 and is electrically coupled to the second capacitor electrode 115 via the contact 213 and the first wiring layer 313. The source or drain region 155 is electrically coupled to a second wiring layer 510 (bit line BL) via a contact 215.

The capacitor 30 includes the first capacitor electrode 111 provided along inside of an opening of a planarized film 200, a ferroelectric film 113 provided on the first capacitor electrode 111 along the opening, and the second capacitor electrode 115 provided to fill the opening. The first capacitor electrode 111 is electrically coupled to the gate electrode 131 of the first transistor 10. The second capacitor electrode 115 is in electrically coupled to the source or drain region 153 via the contact 213 and the first wiring layer 313. It is to be noted that the capacitor 30 may be provided in a trench-type structure as illustrated in FIG. 2, or may be provided in other structures such as a parallel-plate-type structure or a stack-type structure.

Hereinafter, each configuration of the semiconductor memory device 1 will be described in more detail.

The semiconductor substrate 100 is a substrate including a semiconductor material and in which first transistor 10 and second transistor 20 are formed. The semiconductor substrate 100 may be a silicon substrate, and may be an SOI (Silicon On Insulator) substrate in which an insulating film such as $SiO_2$ is sandwiched between silicon substrates. Alternatively, the semiconductor substrate 100 may be a substrate including other elemental semiconductors such as germanium, or a substrate including compound semiconductors such as gallium arsenide (GaAs), gallium nitride (GaN) or silicon carbide (SiC).

An element separation layer 105 includes an insulating material and electrically separates memory cells provided on the semiconductor substrate 100 from each other. The element separation layer 105 may be provided, for example, extending in a first direction (i.e. in the transverse direction when facing FIG. 2, hereinafter the same) of the semiconductor substrate 100 in parallel strip-shaped regions separated from each other. For example, the element separation layer 105 may include an insulating oxynitride such as silicon oxide ($SiO_x$), silicon nitride ($SiN_x$), or silicon oxynitride (SiON).

For example, the element separation layer 105 may be formed by, using an STI (Shallow Trench Isolation) method, removing a portion of the semiconductor substrate 100 of a predetermined region by etching or the like, and thereafter embedding an opening formed by etching or the like with silicon oxide ($SiO_x$). Further, the element separation layer 105 may be formed by thermally oxidizing a predetermined region of the semiconductor substrate 100 using a LOCOS (Local Oxidation of Silicon method.

The parallel strip-shaped regions separated from each other by the element separation layer 105 function as element regions in which the first transistor 10 and the second transistor 20 are formed. For example, a first conductivity type impurity (e.g., a p-type impurity such as boron (B) or aluminum (Al)) may be introduced into the semiconductor substrate 100 of the element region.

The gate insulating film 140 includes an insulating material and is provided on the semiconductor substrate 100. It is to be noted that the gate insulating film 140 is provided on the semiconductor substrate 100 of the element region separated by the element separation layer 105. Thus, the semiconductor memory device 1 is able to prevent an unintended region from functioning as a transistor. The gate insulating film 140 may include an insulating material known as a gate insulating film of a field effect transistor. For example, the gate insulating film 140 may include an insulating oxynitride such as silicon oxide ($SiO_x$), silicon nitride ($SiN_x$), or silicon oxynitride (SiON).

The gate electrodes 131 and 133 each include a conductive material and are each provided on the gate insulating film 140. Specifically, the gate electrodes 131 and 133 are each extended in a second direction perpendicular to the first direction in which the element separation layer 105 extends, and are provided at predetermined intervals in the first direction. The gate electrodes 131 and 133 each extend beyond the element separation layer 105 and are each provided over a plurality of element regions. The gate electrode 131 functions as a plate wiring line PL that electrically couples each gate electrode 131 of the first transistor 10 of each memory cell, and the gate electrode 133 functions as a word wiring line WL that electrically couples each gate electrode 133 of the second transistor 20 of each memory cell. That is, the gate electrodes 131 and 133 function only as a wiring line on the element separation layer 105.

For example, gate electrodes 131 and 133 may include polysilicon or the like, or may include a metal, an alloy, a metal compound, or an alloy of a high melting point metal (such as Ni) and polysilicon (so-called silicide). Specifically, the gate electrodes 131 and 133 may have a stacked structure of a metal layer and a polysilicon layer. For example, the gate electrodes 131 and 133 may have a stacked structure of a polysilicon layer and a metal layer including TiN or TaN provided on the gate insulating film 140. According to such a stacked structure, it is possible to reduce a wiring line resistance of the gate electrodes 131 and 133 as compared to the case where the gate electrodes 131 and 133 only include the polysilicon layer.

The source or drain regions 151, 153, and 155 are regions of the second conductivity type formed in the semiconductor substrate 100. The source or drain regions 151, 153, and 155 are each provided in the semiconductor substrate 100 to interpose the gate electrodes 131 and 133. Specifically, the source or drain region 153 is provided between the gate electrodes 131 and 133, the source or drain region 151 is provided on the opposite side of the source or drain region 153 with the gate electrode 131 interposed therebetween, and the source or drain region 155 is provided on the opposite side of the source or drain region 153 with the gate electrode 133 interposed therebetween. It is to be noted that the source or drain region 151 is electrically coupled to the first wiring layer 311 serving as the source line SL via the contact 211. The source or drain region 153 is electrically coupled to the second capacitor electrode 115 via the contact 213 and the first wiring layer 313. The source or drain region 155 is electrically coupled to the second wiring layer 510 serving as the bit line BL via the contact 215.

For example, the source or drain regions 151, 153, and 155 may be formed by introducing a second conductivity type impurity (for example, an n-type impurity such as phosphorus (P) or arsenic (As)) into the semiconductor substrate 100 of the element regions separated by the element separation layer 105. Further, in the semiconductor substrate 100 between the source or drain regions 151, 153, and 155 and the gate electrodes 131 and 133, an LDD (Lightly-Doped Drain) region may be formed, the LDD region having the same conductivity type as the source or drain regions 151, 153, and 155 and a lower concentration of conductivity type impurities than the source or drain regions 151, 153, and 155.

It is to be noted that, any of the source or drain regions 151, 153, and 155 provided with the gate electrodes 131 and 133 interposed therebetween may function as a source region, and any of them may function as a drain region. They may be arbitrarily changed depending on the polarities of the conductivity type impurities or the wiring line to be coupled to.

A sidewall insulating film 135 includes an insulating material and is provided as a side wall on each of side surfaces of the gate electrodes 131 and 133. Specifically, it is possible to form the sidewall insulating film 135 by uniformly forming an insulating film on a region including the gate electrodes 131 and 133 and then performing vertical anisotropic etching on the insulating film. For example, the sidewall insulating film 135 may be formed in a single or multiple layer by an insulating oxynitride such as silicon oxide ($SiO_x$), silicon nitride ($SiN_x$), or silicon oxynitride (SiON).

The sidewall insulating film 135 controls, when the second conductivity type impurity is introduced into the semiconductor substrate 100, a positional relationship between the gate electrodes 131 and 133 and the source or drain regions 151, 153, and 155 in a self-aligned manner by shielding the second conductivity type impurity. By using the sidewall insulating film 135, it is possible to introduce impurities into the semiconductor substrate 100 in a stepwise manner. Therefore, it becomes possible to form the LDD region in a self-aligned manner between the source or drain regions 151, 153, and 155, and the gate electrodes 131 and 133.

Conduction layers 132 and 134 are respectively provided on the gate electrodes 131 and 133, and function as wiring lines that respectively electrically couple the gate electrodes 131 and 133. Specifically, the conduction layer 132 is provided on an upper surface of the gate electrode 131 and functions as the plate line PL. The conduction layer 134 is provided on an upper surface of the gate electrode 133 and functions as the word line WL. For example, the conduction layers 132 and 134 may each include a metal or a metal compound having a low resistance.

Contact regions 151S, 153, and 155S are provided on the surface of the semiconductor substrate 100 of the source or drain regions 151, 153, and 153, respectively, and reduce contact resistances between the source or drain regions 151, 153, and 153 and the contact 211, 213, and 215, respectively. Specifically, the contact regions 151S, 153S, and 155S may each include an alloy (so-called silicide) of silicon and a metal having a high melting point such as Ni.

The planarized film 200 includes an insulating material, embeds the first transistor 10 and the second transistor 20, and is provided over the entire surface of the semiconductor substrate 100. The planarized film 200 is provided with an opening for exposing the conduction layer 132 on the element region, and the capacitor 30 having a trench-type structure is provided inside the opening. For example, the planarized film 200 may include an insulating oxynitride such as silicon oxide ($SiO_x$), silicon nitride ($SiN_x$), or silicon oxynitride (SiON).

Although not illustrated in FIG. 2, a liner layer including an insulating material may be provided over the entire surface of the semiconductor substrate 100, the sidewall insulating film 135, and the conduction layers 132 and 134. The liner layer provides a high etch selectivity between the liner layer and the planarized film 200 in a process of forming the contacts 211, 213, and 215, thereby preventing the semiconductor substrate 100 from being etched. For example, the liner layer may include an insulating oxynitride such as silicon oxide ($SiO_x$), silicon nitride ($SiN_x$), or silicon oxynitride (SiON). Specifically, in a case where the planarized film 200 is silicon oxide ($SiO_x$), the liner layer may include silicon nitride ($SiN_x$).

The liner layer may also be formed as a layer that applies a compression stress or a tensile stress to the semiconductor substrate 100 below the gate insulating film 140. In such a case, the liner layer is able to improve carrier mobility of a channel formed in the semiconductor substrate 100 by the stress effects.

The first capacitor electrode 111 includes a conductive material and is provided along inside of the opening formed in the planarized film 200. The opening formed in the planarized film 200 is provided to expose the conduction layer 132 on the element region, and the first capacitor electrode 111 is provided on the conduction layer 132 exposed by the opening to be electrically coupled to the gate electrode 131 of the first transistor 10. For this reason, the capacitors 30 are provided for the respective first transistors 10 separately from each other.

For example, the first capacitor electrode 111 may include a metal having a low resistance such as titanium (Ti) or tungsten (W), or a metal compound such as titanium nitride (TiN) or tantalum nitride (TaN). The first capacitor electrode 111 may include ruthenium (Ru), ruthenium oxide ($RuO_2$), or the like. The first capacitor electrode 111 may be formed by sputtering using ALD (Atomic Layer Deposition), CVD (Chemical Vapor Deposition), IMP (Ionized Metal Plasma), or the like.

The ferroelectric film 113 includes a ferroelectric material and is provided on the first capacitor electrode 111 along the inside of the opening formed in the planarized film 200. The ferroelectric film 113 includes a ferroelectric material that spontaneously polarize and is able to control an orientation of remanent polarization by an external electric field. For example, the ferroelectric film 113 may include a ferroelectric material having a perebskite structure, such as lead zirconate titanate ($Pb(Zr,Ti)O_3$: PZT) or strontium bismuth tantalate ($SrBi_2Ta_2O_9$:SBT). Further, the ferroelectric film 113 may be a ferroelectric film in which a film including a high dielectric material such as $HfO_x$, $ZrO_x$, or $HfZrO_x$ is altered by heat treatment or the like, or may be a ferroelectric film in which the film including the above high dielectric material is altered by introducing atoms such as lanthanum (La), silicon (Si), or gadolinium (Gd). In addition, the ferroelectric film 113 may be formed in a single or multiple layer. For example, the ferroelectric film 113 may be a single layer film including a ferroelectric material such as $HfO_x$. It is possible to form the ferroelectric film 113 using ALD (Atomic Layer Deposition), CVD (Chemical Vapor Deposition), or the like.

The second capacitor electrode 115 includes a conductive material and is provided on the ferroelectric film 113 to fill the opening formed in the planarized film 200. For example, the second capacitor electrode 115 may include a metal having a low resistance such as titanium (Ti) or tungsten (W), or a metal compound such as titanium nitride (TiN) or tantalum nitride (TaN). The second capacitor electrode 115 may include ruthenium (Ru), ruthenium oxide ($RuO_2$), or the like. It is possible to form the second capacitor electrode 115 using ALD (Atomic Layer Deposition), CVD (Chemical Vapor Deposition), or the like.

The capacitor 30 is configured by the above-described ferroelectric film 113 being sandwiched by the first capacitor electrode 111 and the second capacitor electrode 115. This allows the semiconductor memory device 1 to store data by the polarization orientation of the ferroelectric film 113 of the capacitor 30.

Here, the ferroelectric film 113 is provided not on the semiconductor substrate 100 including silicon or the like on which an oxide film is easily formed, but on the first capacitor electrode 111. Thus, the semiconductor memory device 1 is able to prevent an oxide film or the like other than the ferroelectric film 113 from being interposed between the first capacitor electrode 111 and the second capacitor electrode 115. Therefore, when a voltage is applied between the first capacitor electrode 111 and the second capacitor electrode 115, the semiconductor memory device 1 is able to prevent a voltage drop caused by the oxide film from occurring and thus is able to suppress a rise of a write voltage.

The contacts 211, 213, and 215 each include a conductive material and are each provided through the planarized film 200. Specifically, the contact 211 is provided on the source or drain region 151 and electrically couples the other of the source and the drain of the first transistor 10 to the first wiring layer 311 (source line SL). The contact 213 is provided on the source or drain region 153 and electrically couples the second capacitor electrode 115 to one of the source or the drain of the first transistor 10 and one of the second transistor 20 via the first wiring layer 313. The contact 215 is provided on the source or drain region 155 and electrically couples the other of the source and the drain of the second transistor 20 to the second wiring layer 510 (bit line BL).

For example, the contacts 211, 213, and 215 may include a metal having a low resistance such as titanium (Ti) or tungsten (W), or a metal compound such as titanium nitride (TiN) or tantalum nitride (TaN). The contacts 211, 213, and 215 may be formed of a single layer or a stack of a plurality of layers. For example, the contacts 211, 213, and 215 may be formed of a stack of Ti or TiN and W.

A first interlayer insulating film 300 embeds first wiring layers 311, 313, and 315, and is provided over the entire surface of the semiconductor substrate 100 on the planarized film 200. For example, the first interlayer insulating film 300 may include an insulating oxynitride such as silicon oxide ($SiO_x$), silicon nitride ($SiN_x$), or silicon oxynitride (SiON).

The first wiring layers 311, 313, and 315 each include a conductive material and are provided on the planarized film 200. Specifically, the first wiring layer 311 is provided on the contact 211 as a wiring line extending in the second direction perpendicular to the first direction in which the first transistor 10 and the second transistor 20 are disposed. The first wiring layer 311 functions as the source line SL by being electrically coupled to the other of the source or drain region of the first transistor 10 via the contact 211. The first wiring layer 313 is provided on the contact 213 and the second capacitor electrode 115 as a wiring line that electrically couples the contact 213 and the second capacitor electrode 115. The first wiring layer 315 is provided on the contact 215 as a via that electrically couples the contact 215 serving as a lower layer and a via 410 serving as an upper layer. The first wiring layers 311, 313, and 315 may each include a metal material such as copper (Cu) or aluminum (Al), and may each have a damascene structure or a dual damascene structure of Cu.

A second interlayer insulating film 400 embeds the via 410 and is provided over the entire surface of the semiconductor substrate 100 on the first interlayer insulating film 300. For example, the second interlayer insulating film 400 may include an insulating oxynitride such as silicon oxide ($SiO_x$), silicon nitride ($SiN_x$), or silicon oxynitride (SiON).

The via 410 includes a conductive material and is provided through the second interlayer insulating film 400. Specifically, the via 410 is provided on the first wiring layer 315 as a via for electrically coupling the first wiring layer 315 serving as a lower layer and the second wiring layer 510 serving as an upper layer. The via 410 may include, for example, a metal having a low resistance such as titanium (Ti) or tungsten (I), or a metal compound such as titanium nitride (TiN) or tantalum nitride (TaN). The via 410 may be formed of a single layer or a stack of a plurality of layers, for example, a stack of Ti or TiN and W.

A third interlayer insulating film 500 embeds the second wiring layer 510 and is provided over the entire surface of the semiconductor substrate 100 on the second interlayer insulating film 400. For example, the third interlayer insulating film 500 may include an insulating oxynitride such as silicon oxide ($SiO_x$), silicon nitride ($SiN_x$), or silicon oxynitride (SiON).

The second wiring layer 510 includes a conductive material and is provided on the via 410 as a wiring line extending in the first direction in which the first transistor 10 and the second transistor 20 are disposed. The second wiring layer 510 functions as a bit line BL by being electrically coupled to the other of the source or drain region of the second transistor 20 via the via 410, the first wiring layer 315, and the contact 215. The second wiring layer 510 may include a metal material such as copper (Cu) or aluminum (Al), for example, and may have a damascene structure or a dual damascene structure of Cu.

According to the above structure, the semiconductor memory device 1 is able to avoid occurrence of a voltage drop caused by the oxide film, because it is possible to apply an electric field to the ferroelectric film 113 sandwiched between the first capacitor electrode 111 and the second capacitor electrode 115 without the interposition of the oxide film.

In addition, according to the above structure, the semiconductor memory device 1 is able to control application of a voltage to the capacitor 30 by the second transistor 20 that controls the selection and non-selection of the capacitor 30. In addition, the semiconductor memory device 1 is able to act as a gain cell that converts the orientation of the remanent polarization of the ferroelectric film 113 to an amount of electric current flowing between the source and the drain of the first transistor 10. Accordingly, even in a case where the amount of polarization of the ferroelectric film 113 is small, the semiconductor memory device 1 is able to obtain a more largely amplified detection signal, which makes it possible to operate more stably.

3. Manufacturing Method

Next, referring to FIGS. 3 to 8, a method of manufacturing the semiconductor memory device 1 according to the present embodiment will be described. FIGS. 3 to 8 are each a plan view and a cross-sectional view for explaining each process of the method of manufacturing the semiconductor memory device 1.

In FIGS. 3 to 8, similarly to FIG. 2, the description of the layers formed over the entire surface of the semiconductor substrate 100 is omitted. Further, the cross-sectional views respectively illustrate cross-sections of the plan view each taken along corresponding one of the AA line, the BB line, and the CC line.

First, as illustrated in FIG. 3, by forming the element separation layer 105 on the semiconductor substrate 100, an element region in which the first transistor 10 and the second transistor 20 are to be provided is formed.

Specifically, a $SiO_2$ film is formed on the semiconductor substrate 100 including Si by dry oxidization or the like, and a $Si_3N_4$ film is further formed by low-pressure CVD (Chemical Vapor Deposition) or the like. Subsequently, a patterned resist layer is formed over the $Si_3N_4$ film to protect the element region, and an $SiO_2$ film, an $Si_3N_4$ film, and the semiconductor substrate 100 are etched to a depth of 350 nm to 400 nm. Next, $SiO_2$ is formed into a film having a thickness of 650 nm to 700 nm, and the element separation layer 105 is formed by embedding an opening formed by etching. For forming $SiO_2$ into a film, for example, high-density plasma CVD may be used, which makes it possible to for a dense $SiO_2$ film having a satisfactory step coverage property.

Subsequently, by removing the excessively formed $SiO_2$ film by using CMP (Chemical Mechanical Polish) or the like, the surface of the semiconductor substrate 100 is planarized. The removal of the $SiO_2$ film by CMP is performed, for example, until the $Si_3N_4$ film is exposed.

Further, hot phosphoric acid or the like is used to remove the $Si_3N_4$ film. It is to be noted that it is also possible to anneal the semiconductor substrate 100 in an $N_2$, $O_2$ or $H_2/O_2$ environment prior to removing the $Si_3N_4$ film, in order to make the $SiO_2$ film of the element separation layer 105 a more dense film, or to round the corners of element region. Next, after the surface of the element region of the semiconductor substrate 100 is oxidized to a thickness of about 10 nm to form an oxide film 100A, the semiconductor substrate 100 of the element region is converted into a well region having a first conductivity type by ion implantation of a first conductivity type impurity (for example, boron (B)).

Next, as illustrated in FIG. 4, after forming a film of the gate insulating film 140, the gate electrodes 131 and 133 are formed on the gate insulating film 140. Thereafter, the sidewall insulating film 135 is formed on each of both sides of the gate electrodes 131 and 133, and the source or drain regions 151, 153, and 155 are formed on the semiconductor substrate 100.

Specifically, first, the oxide film 100A that covers the surface of the semiconductor substrate 100 is peeled off with a hydrofluoric acid solution or the like. Thereafter, the gate insulating film 140 including $SiO_2$ is formed on the semiconductor substrate 100 to have a thickness of 1.5 nm to 10 nm by dry oxidization using $O_2$ at 700° C. or RTA (Rapid Thermal Anneal) treatment. As a gas used for the dry oxidation, $H_2/O_2$, $N_2O$, or NO mixed gas may be used in addition to $O_2$. Further, in forming the gate insulating film 140, it is also possible to use plasma-nitridation to dope the $SiO_2$ film with nitrogen.

Next, polysilicon is formed into a film having a thickness of 50 nm to 150 nm by low-pressure CVD using $SiH_4$ gas as a source gas at a film-forming temperature of 580° C. to 620° C. Thereafter, by performing anisotropic etching using a patterned resist as a mask to the polysilicon formed into a film, to form the gate electrodes 131 and 133. For the anisotropic etching, for example, it is possible to use HBr or Cl-based gas. For example, in a 45 m node, the gate electrodes 131 and 133 may be formed by setting gate widths to about 40 nm to 50 nm.

Subsequently, arsenic (As), which is a second conductivity type impurity, is ion-implanted on both sides of the gate electrodes 131 and 133 at a concentration of $5 \times 10^{13}$ ions/$cm^2$ to $20 \times 10^{13}$ ions/$cm^2$ at 5 keV to 20 keV to form the LDD region. Since it is possible to suppress short-channel effects by forming the LDD region, it is possible to suppress variations in properties of the first transistor 10 and the second transistor 20. It is to be noted that it is also possible to use phosphorus (P) as the second conductivity type impurity.

Next, after forming $SiO_2$ into a film having a thickness of 10 nm to 30 nm by plasma CVD, $Si_3N_4$ is formed into a film having a thickness of 30 nm to 50 nm by plasma CVD, to form an insulating film for the side wall. Thereafter, the insulating film for the side wall is anisotropically etched to form the sidewall insulating film 135 on each of both sides of the gate electrodes 131 and 133.

Subsequently, arsenic (As), which is a second conductivity type impurity, is ion-implanted at a concentration of $1\times10^{15}$ ions/cm$^2$ to $2\times10^{15}$ ions cm$^2$ at 20 keV to 50 keV, and second conductivity type impurities are introduced on both sides of the gate electrodes 131 and 133 and the gate electrodes 131 and 133. As a result, the source or drain regions 151, 153, and 155 are formed on the semiconductor substrate 100 on both sides of the gate electrodes 131 and 133. Further, RTA (Rapid Thermal Annealing) is performed at 1000° C. for 5 seconds to activate the ion-implanted impurities. Thus, the first transistor 10 and the second transistor 20 are formed. It is to be noted that, to allow the activation of the introduced impurities to be accelerated and the diffusion of the impurities to be suppressed, it is also possible to activate the impurities by spike RTA.

Next, as illustrated in FIG. 5, the conduction layers 132 and 134 and the contact regions 151S, 153S, and 155S are formed on the gate electrodes 131 and 133 and the source or drain regions 151, 153, and 155. Thereafter, the planarized film 200 is formed over the entire surface of the semiconductor substrate 100, and then the contacts 211, 213, and 215 are formed.

Specifically, Ni is formed into a film having a thickness of 6 nm to 8 nm over the entire surface of the semiconductor substrate 100 by sputtering or the like, and thereafter, RTA is performed at 300° C. to 450° C. for 10 seconds to 60 seconds, thereby causing Ni on Si to be silicified (NiSi). Since Ni on SiO$_2$ remains unreacted, removing the unreacted Ni using H$_2$SO$_4$/H$_2$O$_2$ forms the conduction layers 132 and 134 and the contact regions 151S, 153S, and 155S each including NiSi having a low resistance on the gate electrodes 131 and 133 and the source or drain regions 151, 153, and 155. It is to be noted that, by forming Co or NiPt, instead of Ni, into a film, the conduction layers 132 and 134 and the contact regions 151S, 153S, and 155S may be formed by CoSi$_2$ or NiSi. The temperature at which RTA is performed in the case of forming Co or NiPt into a film may be appropriately set.

Subsequently, although not illustrated, the liner layer including SiN is formed on the semiconductor substrate 100 over the entire surface of the semiconductor substrate 100. Specifically, SiN is formed into a film having a thickness of 10 nm to 50 nm by plasma CVD to form the liner layer. It is to be noted that it is also possible to form the liner layer as a layer which applies a compression stress or a tensile stress. By forming the liner layer, it is possible to etch the planarized film 200 under the condition that the etch selectivity between the planarized film 200 and the liner layer becomes high, which enables to perform the etching with higher controllability.

Thereafter, SiO$_2$ is formed into a film having a thickness of 100 n to 500 nm by CVD or the like on the semiconductor substrate 100, and then planarization is performed by the CMP method to form the planarized film 200. The planarized film 200 is then etched to form an opening in the planarized film 200 to expose the contact regions 151S, 153S, and 155S. Subsequently, Ti and TiN are formed into a film by CVD or the like on the opening of the planarized film 200, and W is further formed into a film and then planarized by CMP to form the contacts 211, 213, and 215 on the contact regions 151S, 153S, and 155S. It is to be noted that Ti and TiN may be formed into a film by sputtering using IMP (Ion Metal Plasma) or the like. In addition, the planarization may be performed by full-surface etch-back instead of the CMP method.

Next, as illustrated in FIG. 6, an opening that penetrates the planarized film 200 and exposes the conduction layer 132 of the first transistor 10 is formed to form the capacitor 30 inside the opening.

Specifically, the opening is formed on the gate electrode 131 of the first transistor 10 to expose the conduction layer 132 by a lithographically patterned resist-masked anisotropic etching. A planar shape of the opening may be, for example, the same as a planar shape of each of the contacts 211, 213, and 215, or may be different. For the anisotropic etching, for example, a fluorocarbon-based gas may be used.

Next, using sputtering by ALD, CVD or IMP, TiN is formed into a film having a thickness of 5 n to 20 nm on the on conduction layer 132 along an inner shape of the opening formed in the planarized film 200. It is to be noted that TaN, Ru, RuO$_2$, or the like, instead of TiN, may be used as a material for forming the first capacitor electrode 111. Thereafter, by performing anisotropic etching to the TiN film that has been formed, a recessing is performed inside the opening, to form the first capacitor electrode 111. Specifically, after applying a resist on the TiN film that has been formed, etching is performed under a condition where the etching rate of TiN and the resist is about the same, thereby forming a recess while leaving TiN at the bottom of the opening. It is to be noted that a depth of the recess may be adjusted at any depth.

Subsequently, hafnium oxide (HfO$_x$), which is a high dielectric material, is formed into a film having a thickness of 3 nm to 10 nm along the inner shape of the opening formed in the planarized film 200 on the first capacitor electrode 111 by CVD or ALD, thereby forming the ferroelectric film 113. It is to be noted that hafnium oxide, which is a high dielectric material (HfO$_x$), is converted into a ferroelectric material by performing annealing treatment at a later stage.

It is to be noted that, instead of hafnium oxide, a high dielectric material such as zirconium oxide (ZrO$_x$) or hafnium zirconium oxide (HfZrO$_x$) may also be used. Further, it is also possible to convert such a high dielectric material into a ferroelectric material by being doped with lanthanum (La), silicon (Si), gadolinium (Gd), or the like. Still further, it is also possible to use a perebskite-based ferroelectric material such as lead zirconate titanate (PZT) or strontium bismuth tantalate (SBT) as the ferroelectric film 113.

Thereafter, TN is formed in to a film having a thickness of 5 nm to 20 nm on the ferroelectric film 113 by CVD, ALD, sputtering, or the like to fill the opening formed in the planarized film 200, thereby forming the second capacitor electrode 115. It is to be noted that, as a material for forming the second capacitor electrode 115, it is also possible to use TaN, Ru, or RuO$_2$. Subsequently, crystallization annealing is performed to convert HfO$_x$ (currently high dielectric material) that is included in the ferroelectric film 113 into a ferroelectric material. It is to be noted that the crystallization annealing that converts HfO$_x$ into the ferroelectric material may be performed in this process, or may be performed after the following CMP. The crystallization annealing may be performed, for example, in the range of 400° C. to 600° C. for about 10 seconds to 3 minutes. Thereafter, by performing CMP or fill-surface etch-back, the ferroelectric film 113 and the second capacitor electrode 115 excessively formed on the planarized film 200 are removed.

Next, as illustrated in FIG. 7, after the first interlayer insulating film 300 is formed over the entire surface of the semiconductor substrate 100, the first wiring layers 311, 313, and 315 are formed.

Specifically, SiO$_2$ is formed into a film having a thickness of 100 nm to 500 nm on the entire surface of the planarized film 200 by CVD or the like, and then planarization is performed by the CMP method to form the first interlayer insulating film 300. Subsequently, the first interlayer insulating film 300 is etched to form openings for establishing electric connections with the contact 211, 213, and 215, and then a damascene structure or a dual damascene structure is used to form the first wiring layers 311, 313, and 315 using Cu or the like as a wiring line material. It is to be noted that the first wiring layers 311, 313, and 315 may include Al or the like.

The first wiring layer 311 functions as the source line SL by being extended on the contact 211 in the second direction perpendicular to the first direction in which the first transistor 10 and the second transistor 20 are disposed. Further, the first wiring layer 313 electrically couples the second capacitor electrode 115 to the contact 213. The first wiring layer 315 electrically couples the via 410 to the contact 215.

Next, as illustrated in FIG. 8, the second interlayer insulating film 400 is formed on the first interlayer insulating film 300 over the entire surface of the semiconductor substrate 100, and then the via 410 is formed. Thereafter, the third interlayer insulating film 500 is formed on the second interlayer insulating film 400 over the entire surface of semiconductor substrate 100, and then the second wiring layer 510 is formed.

Specifically, SiO$_2$ is formed into a film having a thickness of 100 m to 500 nm on the entire surface of the first interlayer insulating film 300 by CVD or the like, and then planarization is performed by the CMP method to form the second interlayer insulating film 400. Subsequently, the second interlayer insulating film 400 is etched to form an opening for establishing an electrical connection to the first wiring layer 315. Next, with respect to the formed opening, TiN is formed into a film by CVD or the like, W is further formed into a film, and thereafter, planarization is performed by CMP, thereby forming the via 410. It is to be noted that TN may be formed into a film by a sputtering method using IMP or the like. In addition, planarization may be performed using full-surface etch-back instead of CMP.

Next, SiO$_2$ is formed into a film having a thickness of 100 nm to 500 nm over the entire surface of the second interlayer insulating film 400 by CVD or the like, and then planarization is performed by the CMP method to form the third interlayer insulating film 500. Next, the third interlayer insulating film 500 is etched to form an opening for contact with the via 410, and then the second wiring layer 510 including Cu or the like as a wiring line material is formed by using a damascene structure or a dual damascene structure. It is to be noted that the second wiring layer 510 may include Al or the like. It is to be noted that the second wiring layer 510 functions as the bit line BL by being extended on the via 410 in the first direction in which the first transistor 10 and the second transistor 20 are disposed.

Through the above processes, it is possible to form the semiconductor memory device 1 according to the present embodiment.

4. Operation Example

Subsequently, a write operation and a read operation of the semiconductor memory device 1 described above will be described with reference to FIGS. 9 and 10. FIG. 9 is a graph illustrating an example of a hysteresis curve between an amount of polarization of the ferroelectric film 113 and an applied voltage. FIG. 10 is a graph illustrating an example of a relationship between a voltage applied to the gate of the first transistor 10 and an electric current flowing between the source and the drain.

Table 1 below is a table indicating an example of a voltage (unit: V) applied to each wiring line in the write operation and the read operation of the semiconductor memory device 1. It is to be noted that, in Table 1, "Vt" is a threshold voltage for turning a channel of the second transistor 20 to an on-state, "Vdd" is a predetermined voltage higher than Vt, and "Vpp" is a voltage capable of inverting a polarization state of the capacitor 30. Further, "OFF" indicates that a corresponding wiring line is in a floating state.

TABLE 1

|  | Word line WL | Bit line BL | Plate line PL | Source line SL |
| --- | --- | --- | --- | --- |
| Writing "1" | Vpp + Vt | Vpp | 0 | OFF |
| Writing "0" | Vpp + Vt | 0 | Vpp | OFF |
| Reading | Vdd | Vpp/3 | OFF | 0 |

For example, in a case where data of "1" is written to a memory cell of the semiconductor memory device 1, as indicated in Table 1, Vpp+Vt is applied to the word line WL coupled to the selected memory cell, and Vpp is applied to the bit line BL. The plate line PL is 0 V and the source line SL is in the floating state. It is to be noted that a voltage obtained by adding Vpp to the threshold voltage Vt is applied to the word line WL in view of a voltage drop that occurs when the second transistor 20 performs a transfer operation.

In such a case, a potential of Vpp is applied to the second capacitor electrode 115 from the bit line BL via the second transistor 20. In contrast, a potential of 0 V is applied to the first capacitor electrode 111 from the plate line PL. As a result, a potential difference of Vpp with a high potential at the second capacitor electrode 115 is applied to the ferroelectric film 113 of the capacitor 30, and thus remanent polarization of the ferroelectric film 113 is controlled in the positive orientation of the hysteresis curve illustrated in FIG. 10. Therefore, the semiconductor memory device 1 is able to write, for example, data of "1" to the selected memory cell.

Further, in a case where data of "0" is written to a memory cell of the semiconductor memory device 1, as indicated in Table 1, Vpp+Vt is applied to the word line WL coupled to the selected memory cell, and Vpp is applied to the plate line PL. The bit line BL is 0 V and the source line SL is in the floating state. It is to be noted that, as described above, a voltage obtained by adding Vpp to the threshold voltage Vt is applied to the word line WL in view of a voltage drop that occurs when the second transistor 20 performs a transfer operation.

In such a case, a potential of 0 V is applied to the second capacitor electrode 115 from the bit line BL via the second transistor 20. In contrast, a potential of Vpp is applied to the first capacitor electrode 111 from the plate line PL. As a result, a potential difference of Vpp with a high potential at the first capacitor electrode 111 is applied to the ferroelectric film 113 of the capacitor 30, and thus remanent polarization of the ferroelectric film 113 is controlled in the negative orientation of the hysteresis curve illustrated in FIG. 10. Therefore, the semiconductor memory device 1 is able to write, for example, data of "0" to the selected memory cell.

In contrast, data is read from a memory cell of the semiconductor memory device 1 by using variation in the threshold voltage of the first transistor 10, the variation being depending on whether data stored in the capacitor 30 is "0" or "1".

For example, in a case where data is read from a memory cell of the semiconductor memory device 1, as indicated in Table 1. Vdd is applied to the word line WL coupled to the selected memory cell, and Vpp/3 is applied to the bit line BL. The plate line PL is in the floating state and the source line SL is 0 V. It is to be noted that the voltage to be applied to the bit line BL may be a voltage that is low enough not to invert the polarization state of the ferroelectric film 113, and may be set to any value lower than or equal to Vpp3, for example.

In such a case, the voltage Vpp/3 applied to the bit line BL is applied to the second capacitor electrode 115 via the second transistor 20. Here, the plate line PL electrically coupled to the first capacitor electrode 111 and the gate electrode 131 is in the floating state. Therefore, a voltage obtained by distributing the voltage Vpp/3 by the inverse ratio of a parasitic capacitance of the gate insulating film 140 of the first transistor 10 and a capacitance of the capacitor 30 is applied to the gate electrode 131 of the first transistor 10. Specifically, to the gate electrode 131 of the first transistor 10, $V_{IL}$ in the following Equation 1 is applied.

[Math. 1]

$$Vgc = V_{IL} + V_{FE} = \frac{C_{FE}}{C_{FE} + C_{IL}} Vgc + \frac{C_{IL}}{C_{FE} + C_{IL}} Vgc \quad \text{Equation 1}$$

In Equation 1, $V_{IL}$ is a voltage to be applied to the gate insulating film 140 of the first transistor 10, $V_{FE}$ is a voltage applied to the ferroelectric film 113 of the capacitor 30, and Vgc is a potential difference (i.e., Vpp/3) between the second capacitor electrode 115 and the source line SL. Further, $C_{IL}$ is the parasitic capacitance of the gate insulating film 140 of the first transistor 10, and CFE is the capacitance of the capacitor 30.

Therefore, when reading the stored data, the gate electrode 131 of the first transistor 10 is applied with a portion of the voltage Vpp/3 applied to the bit line BL, and a voltage Vds between the source and the drain of the first transistor 10 is Vpp/3.

As indicated in FIG. 10, the threshold voltage of the first transistor 10 is greatly influenced by the orientation of the remanent polarization of the capacitor 30 electrically coupled to the gate electrode 131. For example, as indicated in FIG. 10, in a case where the capacitor 30 stores data "1" with a high potential at the second capacitor electrode 115, the threshold voltage of the first transistor 10 increases. In contrast, in a case where the capacitor 30 stores data "0" with a high potential at the first capacitor electrode 111, the threshold voltage of the first transistor 10 decreases.

Therefore, the threshold voltage of the first transistor 10 is controlled such that the presence or absence of electric current Ids between the source and the drain of the first transistor 10 is determined depending on the orientation of the remanent polarization of the ferroelectric film 113, which makes it possible to read data stored in the ferroelectric film 113.

It is appreciated from Equation 1 that the voltage $V_{FE}$ applied to the ferroelectric film 113 of the capacitor 30 is smaller than the potential difference (i.e., Vpp/3) between the second capacitor electrode 115 and the source line SL. Thus, if the potential difference between the bit line BL and the source line SL is less than V pp, then the polarization state of the capacitor 30 does not change. This allows the semiconductor memory device 1 to prevent data stored in the capacitor 30 from being rewritten when data is read.

Further, in the semiconductor memory device 1, a plurality of memory cells is provided along the plate line PL; therefore, $C_{IL}$ of Equation 1 is the sum of the parasitic capacitances of the gate insulating film 140 of the first transistor 10 in a plurality of memory cells provided along a single plate line PL. Accordingly, in the semiconductor memory device 1, since $C_{IL}$ is extremely large with respect to $C_{FE}$, it is possible to prevent a depolarization phenomenon in which the polarization state is canceled in the capacitor 30 from occurring.

5. Application Example

Next, an electronic apparatus according to an embodiment of the present disclosure will be described. The electronic apparatus according to an embodiment of the present disclosure includes various types of electronic apparatuses each having a circuit including the semiconductor memory device 1 described above is mounted thereon. Referring to FIGS. 11A to 11C, examples of the electronic apparatus according to the present embodiment will be described. FIGS. 11A to 11C are each an external view of an example of the electronic apparatus according to the present embodiment.

For example, the electronic apparatus according to the present embodiment may be an electronic apparatus such as a smart phone. More specifically, as illustrated in FIG. 11A, a smartphone 900 includes a display 901 that displays various types of data, and an operation part 903 including a button and the like that accepts an operation input from a user. A circuit mounted on the smartphone 900 may be provided with the semiconductor memory device 1 described above.

For example, the electronic apparatus according to the present embodiment may be an electronic apparatus such as a digital camera. Specifically, as illustrated in FIGS. 11B and 11C, a digital camera 910 includes a main body part (camera body) 911, an interchangeable lens unit 913, a grip part 915 gripped by a user during shooting, a monitor 917 that displays various types of data, and an EVF (Electronic View Finder) 919 that displays a through image observed by the user during shooting. It is to be noted that FIG. 11B is an external view in which the digital camera 910 is viewed from the front (i.e., subject side), and FIG. 11C is an external view in which the digital camera 910 is viewed from the back (i.e., shooter side). Here, a circuit mounted on the digital camera 910 may be provided with the semiconductor memory device 1 described above.

It is to be noted that the electronic apparatus according to the present embodiment is not limited to the above examples. The electronic apparatus according to the present embodiment may be an electronic apparatus of any field. Examples of such an electronic apparatus include a glasses-shaped wearable device, an HMD (Head Mounted Display), a television apparatus, an electronic book, a PDA (Personal Digital Assistant), a notebook personal computer, a video camera, a game console, or the like.

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure can arrive at various alterations and modifications within the scope of the technical idea described in the appended claims, and it is understood that such alterations and modifications naturally fall within the technical scope of the present disclosure.

Furthermore, the effects described herein are merely illustrative and exemplary, and not limiting. That is, the technique according to the present disclosure can exert other effects that are apparent to those skilled in the art from the description herein, in addition to the above-described effects or in place of the above-described effects.

It is to be noted that the present disclosure may have the following configurations.

(1)

A semiconductor memory device including:

a first transistor;

a capacitor provided with a pair of capacitor electrodes opposed to each other via an insulator, one of the capacitor electrodes being electrically coupled to a gate electrode of the first transistor;

a second transistor in which one of a source or a drain is electrically coupled to one of a source or a drain of the first transistor and to another of the capacitor electrodes; and a plate line electrically coupled to the gate electrode of the first transistor and to the one of the capacitor electrodes.

(2)

The semiconductor memory device according to (1), in which the insulator includes a ferroelectric.

(3)

The semiconductor memory device according to (1) or (2), further including:

a source line electrically coupled to another of the source or the drain of the first transistor;

a bit line electrically coupled to another of the source or the drain of the second transistor; and a word line electrically coupled to a gate electrode of the second transistor.

(4)

The semiconductor memory device according to (3), in which the bit line is provided extending in a first direction in which the first transistor and the second transistor are disposed.

(5)

The semiconductor memory device according to (4), in which the source line is provided extending in a second direction perpendicular to the first direction.

(6)

The semiconductor memory device according to (5), in which the word line and the plate line are provided extending in the second direction.

(7)

The semiconductor memory device according to any one of (1) to (6), in which the capacitor is provided on the gate electrode of the first transistor.

(8)

The semiconductor memory device according to (7), in which the capacitor is provided inside an opening formed in a planarized film, the planarized film embedding the first transistor and the second transistor.

(9)

The semiconductor memory device according to (8), in which the capacitor includes the one of the capacitor electrodes provided along the opening, the insulator provided on the one of the capacitor electrode along the opening, and the other of the capacitor electrodes provided on the insulator to fill the opening.

(10)

The semiconductor memory device according to (8) or (9), in which the other of the capacitor electrodes is electrically coupled to, via a contact provided through the planarized film, the one of the source or the drain of the first transistor and the one of the source or the drain of the second transistor.

(11)

An electronic apparatus including a semiconductor memory device, the semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, and a plate line electrically coupled to the gate electrode of the first transistor and to the one of the capacitor electrodes.

(12)

A method of reading data that is performed on a semiconductor memory device including a first transistor, a capacitor provided with a pair of capacitor electrodes opposed to each other via an insulator, one of the capacitor electrodes being electrically coupled to a gate electrode of the first transistor, a second transistor in which one of a source or a drain is electrically coupled to one of a source or a drain of the first transistor and to another of the capacitor electrodes, a plate line electrically coupled to the gate electrode of the first transistor and to the one of the capacitor electrodes, a word line electrically coupled to a gate electrode of the second transistor, a source line electrically coupled to another of the source or the drain of the first transistor, and a bit line electrically coupled to another of the source or the drain of the second transistor, the method including reading data stored in the capacitor by causing the plate line to be in a floating state, applying a voltage larger than or equal to a threshold voltage of the second transistor to the word line, and applying a predetermined voltage between the bit line and the source line.

REFERENCE SIGNS LIST

1 semiconductor memory device
10 first transistor
20 second transistor
30 capacitor
100 semiconductor substrate
105 element separation layer
111 first capacitor electrode
113 ferroelectric film
115 second capacitor electrode
131, 133 gate electrode
132, 134 conduction layer
135 sidewall insulating film
140 gate insulating film
151, 153, 155 drain region
151S, 153S, 155S contact region
200 planarized film
211, 213, 215 contact
300 first interlayer insulating film
311, 313, 315 first wiring layer
400 second interlayer insulating film 410 via
500 third interlayer insulating film
510 second wiring layer

What is claimed is:

1. A semiconductor memory device, comprising:
a first transistor;
a capacitor provided with a pair of capacitor electrodes opposed to each other via an insulator, one of the capacitor electrodes being electrically coupled to a gate electrode of the first transistor;
a second transistor in which one of a source or a drain is electrically coupled to one of a source or a drain of the first transistor and to another of the capacitor electrodes;
a plate line electrically coupled to the gate electrode of the first transistor and to the one of the capacitor electrodes;
a source line electrically coupled to another of the source or the drain of the first transistor;
a bit line electrically coupled to another of the source or the drain of the second transistor; and
a word line electrically coupled to a gate electrode of the second transistor.

2. The semiconductor memory device according to claim 1, wherein the insulator includes a ferroelectric.

3. The semiconductor memory device according to claim 1, wherein the bit line is provided extending in a first direction in which the first transistor and the second transistor are disposed.

4. The semiconductor memory device according to claim 3, wherein the source line is provided extending in a second direction perpendicular to the first direction.

5. The semiconductor memory device according to claim 4, wherein the word line and the plate line are provided extending in the second direction.

6. The semiconductor memory device according to claim 1, wherein the capacitor is provided on the gate electrode of the first transistor.

7. A semiconductor memory device, comprising:
a first transistor;
a capacitor provided with a pair of capacitor electrodes opposed to each other via an insulator, one of the capacitor electrodes being electrically coupled to a gate electrode of the first transistor;
a second transistor in which one of a source or a drain is electrically coupled to one of a source or a drain of the first transistor and to another of the capacitor electrodes; and
a plate line electrically coupled to the gate electrode of the first transistor and to the one of the capacitor electrodes,
wherein the capacitor is provided on the gate electrode of the first transistor, and
wherein the capacitor is provided inside an opening formed in a planarized film, the planarized film embedding the first transistor and the second transistor.

8. The semiconductor memory device according to claim 7, wherein the capacitor includes the one of the capacitor electrodes provided along the opening, the insulator provided on the one of the capacitor electrodes along the opening, and the other of the capacitor electrodes provided on the insulator to fill the opening.

9. The semiconductor memory device according to claim 7, wherein the other of the capacitor electrodes is electrically coupled to, via a contact provided through the planarized film, the one of the source or the drain of the first transistor and the one of the source or the drain of the second transistor.

10. A method of reading data that is performed on a semiconductor memory device including
a first transistor,
a capacitor provided with a pair of capacitor electrodes opposed to each other via an insulator, one of the capacitor electrodes being electrically coupled to a gate electrode of the first transistor,
a second transistor in which one of a source or a drain is electrically coupled to one of a source or a drain of the first transistor and to another of the capacitor electrodes,
a plate line electrically coupled to the gate electrode of the first transistor and to the one of the capacitor electrodes,
a word line electrically coupled to a gate electrode of the second transistor,
a source line electrically coupled to another of the source or the drain of the first transistor, and
a bit line electrically coupled to another of the source or the drain of the second transistor,
the method comprising reading data stored in the capacitor by causing the plate line to be in a floating state, applying a voltage larger than or equal to a threshold voltage of the second transistor to the word line, and applying a predetermined voltage between the bit line and the source line.

11. The semiconductor memory device according to claim 7, wherein the insulator includes a ferroelectric.

12. The semiconductor memory device according to claim 7, further comprising:
a source line electrically coupled to another of the source or the drain of the first transistor;
a bit line electrically coupled to another of the source or the drain of the second transistor; and
a word line electrically coupled to a gate electrode of the second transistor.

13. The semiconductor memory device according to claim 12, wherein the bit line is provided extending in a first direction in which the first transistor and the second transistor are disposed.

14. The semiconductor memory device according to claim 13, wherein the source line is provided extending in a second direction perpendicular to the first direction.

15. The semiconductor memory device according to claim 14, wherein the word line and the plate line are provided extending in the second direction.

16. The semiconductor memory device according to claim 6, wherein the capacitor is provided inside an opening formed in a planarized film, the planarized film embedding the first transistor and the second transistor.

17. The semiconductor memory device according to claim 16, wherein the capacitor includes the one of the capacitor electrodes provided along the opening, the insulator provided on the one of the capacitor electrodes along the opening, and the other of the capacitor electrodes provided on the insulator to fill the opening.

18. The semiconductor memory device according to claim 16, wherein the other of the capacitor electrodes is electrically coupled to, via a contact provided through the planarized film, the one of the source or the drain of the first transistor and the one of the source or the drain of the second transistor.

* * * * *